United States Patent
Rodder et al.

(10) Patent No.: US 6,306,712 B1
(45) Date of Patent: *Oct. 23, 2001

(54) SIDEWALL PROCESS AND METHOD OF IMPLANTATION FOR IMPROVED CMOS WITH BENEFIT OF LOW CGD, IMPROVED DOPING PROFILES, AND INSENSITIVITY TO CHEMICAL PROCESSING

(75) Inventors: Mark S. Rodder, University Park; Mahalingam Nandakumar, Richardson, both of TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/205,637

(22) Filed: Dec. 3, 1998

Related U.S. Application Data

(60) Provisional application No. 60/067,660, filed on Dec. 5, 1997.

(51) Int. Cl.$^7$ ................................................ H01L 21/336
(52) U.S. Cl. .................. 438/289; 438/291; 438/300; 438/302; 438/305; 438/525; 438/217; 438/231; 438/276
(58) Field of Search .................. 438/525, 230, 438/231, 289, 290, 291, 276, 302, 303, 305, 595, FOR 169, 300, 217; 257/336

(56) References Cited

U.S. PATENT DOCUMENTS

| | | | |
|---|---|---|---|
| 4,769,686 | * | 9/1988 | Horiuchi et al. . |
| 5,168,072 | * | 12/1992 | Moslehi . |
| 5,391,510 | * | 2/1995 | Hsu et al. . |
| 5,409,848 | * | 4/1995 | Han et al. . |
| 5,510,279 | * | 4/1996 | Chien et al. . |
| 5,532,508 | * | 7/1996 | Kaneko et al. ............ 257/366 |
| 5,578,509 | * | 11/1996 | Fujita . |
| 5,759,901 | * | 6/1998 | Loh et al. ............... 438/305 |
| 5,817,551 | * | 10/1998 | Fujii et al. ............. 438/200 |
| 5,851,886 | * | 12/1998 | Peng ...................... 438/289 |
| 5,856,225 | * | 1/1999 | Lee et al. ............... 438/291 |
| 5,920,776 | * | 7/1999 | Fratin et al. ........... 438/257 |

OTHER PUBLICATIONS

1997 IEEE, "A 0.10μm Gate Length CMOS Technology With 30Å Gate Dielectric for 1.0V–1.5V Applications," pp. 9.3.1–9.3.4 (M. Rodder, M. Hanratty, D. Rogers, T. Laaksonen, J.C. Hu, S. Murtaza, C.P. Chao, S. Hattangady, S. Aur, A Amersekera and I.C. Chen).

* cited by examiner

Primary Examiner—Mary Wilczewski
(74) Attorney, Agent, or Firm—Jacqueline J. Garner; W. James Brady, III; Frederick J. Telecky, Jr.

(57) ABSTRACT

A transistor (30) and method for forming a transistor using an edge blocking material (24) is disclosed herein. The edge blocking material (24) may be located adjacent a gate (22) or disposable gate or may be part of a disposable gate. During an angled pocket implant, the edge blocking material (24) blocks some dopant from entering the semiconductor body (10) and the dopant (18) placed under the edge blocking material is located at a given distance below the surface of the semiconductor body (10).

12 Claims, 3 Drawing Sheets

SIDEWALL PROCESS AND METHOD OF IMPLANTATION FOR IMPROVED CMOS WITH BENEFIT OF LOW CGD, IMPROVED DOPING PROFILES, AND INSENSITIVITY TO CHEMICAL PROCESSING

This application claims priority under 35 USC §119(e)(1) of provisional application No. 60/067,660, filed Dec. 5, 1997.

FIELD OF THE INVENTION

The invention is generally related to the field of CMOS transistors and more specifically to a sidewall process for a CMOS transistor.

BACKGROUND OF THE INVENTION

As semiconductor devices are scaled to smaller dimensions, generally in the sub-0.1 μm region, it becomes more difficult to fabricate transistors with high drive current and small short-channel effects (i.e., reduced threshold voltage roll-off). To this end, pocket implant processes have been implemented to reduce the threshold voltage (Vt) rolloff, reduce the nominal Vt, and thus improve the nominal drive current. The pocket implant process is a process whereby a region of dopants (referred to herein as a pocket region) opposite to the type used for source/drain (and/or source/drain extension) regions is formed adjacent to the source/drain (and/or source/drain extension) regions. The lateral extent of the pocket region is typically less than the channel length of the MOSFET such that the formation of the pocket results in a laterally non-uniform dopant region from the source and/or drain and/or drain extension to the interior of the channel region. While the pocket implant may reduce short-channel effects, it may also increase the channel surface doping nearest the drain extension (and/or source extension) tip to a significant lateral extent to the interior of the channel region. This, in turn, lowers surface mobility due to dopant scattering. So, while drive current is improved by the pocket implant due to lower nominal Vt, the drive current is not as improved as it could be due to enhanced dopant scattering.

Additionally, source and/or drain extension region (referred to hereafter as "drain extension region") doping processes have been implemented to reduce the source and/or drain extension region parasitic resistance and to reduce the Vt rolloff and thus improve the nominal drive current. To achieve both low parasitic resistance and low Vt rolloff, the drain extension regions should be of sufficient junction depth to allow for low parasitic resistance but with small gate overlap of the drain extension regions.

It is desired therefore to provide for a structure with improved pocket implant process for high drive current. It is additionally desired to have a structure allowing for use of moderate drain extension implant energies for formation of drain extension regions which have low parasitic resistance with sufficiently low gate overlap of the drain extension regions.

SUMMARY OF THE INVENTION

A transistor and method for forming a transistor using an edge blocking material is disclosed herein. The edge blocking material may be located adjacent a gate or disposable gate or may be part of a gate or disposable gate. During an angled pocket implant, the edge blocking material limits the implant range of dopants to be less than that in the semiconductor body and the dopant placed under the edge blocking material is in part located at a given distance below the surface of the semiconductor body. The edge blocking material in part may limit the portion of the angled pocket implant that penetrates through a gate electrode to the underlying channel region the semiconductor body.

An advantage of the invention is providing a transistor having reduced short channel effects as well as improved surface mobility due to a pocket placed with peak doping below the surface of the channel and/or due to a reduced length of high pocket doping at the channel surface extending laterally from the drain extension regions inwards to the channel region.

Another advantage of the invention is providing a transistor having reduced gate-to-drain and gate-to source capacitance.

Another advantage of the invention is providing a method of forming a transistor using a sidewall spacer that is relatively insensitive to clean-up processes.

These and other advantages will be apparent to those of ordinary skill in the art having reference to the specification in conjunction with the drawings.

DETAILED DESCRIPTION OF THE EMBODIMENTS

The invention will now be described in conjunction with a tenth micron n-type transistor using a CMOS process. It will be apparent to those of ordinary skill in the art that the benefits of the invention may be applied to other CMOS processes (as well as NMOS and PMOS), and transistor sizes. It will also be apparent to those of ordinary skill in the art that the invention may be applied to p-type transistors by reversing the conductivity types.

Figure 1:
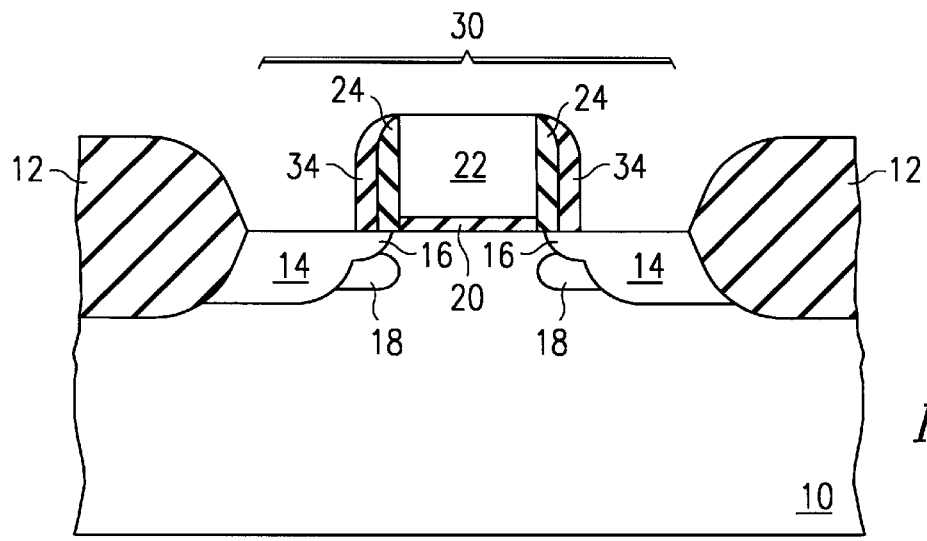
FIG. 1 is a cross-sectional diagram of a transistor having a pocket implant spaced below a surface of the substrate and/or having a reduced length of high pocket doping at the channel surface extending laterally from the drain extension regions inwards to the channel region according to the invention.

A first embodiment of the invention is shown in FIG. 1. Transistor 30 is located in p-type substrate 10. Substrate 10 may alternatively refer to a p-type epitaxial layer formed on a substrate or a p-type well region formed in a substrate or epitaxial layer. Transistor 30 is isolated from other devices (not shown) by isolation regions 12. Isolation regions 12 are shown as field oxide regions. However, other types of isolation, such as shallow trench isolation, may also be used. Regions 16 are highly doped regions (n-type) commonly referred to as drain extensions. Transistor 30 may also include deep source/drain regions 14. As will be discussed further hereinbelow, transistor 30 may additionally or alternatively include raised source/drain regions.

Pocket regions 18 are doped oppositely to drain extension regions 16. In the case of the n-type transistor, regions 18 are p-type. Peak concentration of the pocket regions 18 are spaced from the surface of the substrate 10 to a greater extent and/or the lateral extent of a high pocket concentration at the channel surface, extending from the drain extension inwards to the channel region, is reduced as will be described. Thus, the benefits of traditional pocket regions, i.e., reduced threshold voltage rolloff, reduced nominal Vt, and improved nominal drive current, are maintained. In addition, drawback of conventional pockets, i.e., enhanced dopant scattering due to enhanced dopant concentration over a large lateral extent near the channel surface, is significantly reduced. Because the pocket regions 18 do not have a peak concentration to a significant lateral extent at the surface and/or are spaced from the surface of the substrate, the dopant concentration at the surface of the channel is not significantly enhanced by the pocket as compared to conventional methods of forming transistors.

Gate electrode 22 is located on a gate dielectric 20. Gate dielectric 20 may be any suitable gate dielectric known in the art. Typically, gate dielectric 20 will comprise an oxide. Gate electrode 22 comprises a conductive material such as polysilicon, silicide, metal, or a combination thereof.

A thin sidewall spacer 24 preferably of thickness 10–25 nanometers is located on the sidewalls of gate electrode 22. Spacer 24 comprises a material or a composite of materials that reduces the implant range of dopants thus preventing dopants from reaching the surface of substrate 10 under the spacer 24 during an angled implant and/or reducing the lateral extension of dopants from the chain extension edge inwards to the channel at the surface of substrate 10 during an angled implant. The material chosen for spacer 24 has a smaller implant range than the underlying substrate and may include in part silicon nitride or silicon carbide. Additionally, silicon nitride and silicon carbide are materials which are not significantly reduced in thickness by standard wet chemical cleaning or stripping processes as compared to other materials as deposited oxides.

A method for forming the first embodiment of the invention will now be described. The substrate 10 is processed through the formation of isolation regions 12 and any well implants and threshold adjust implants as is well known in the art.

Figure 2A:
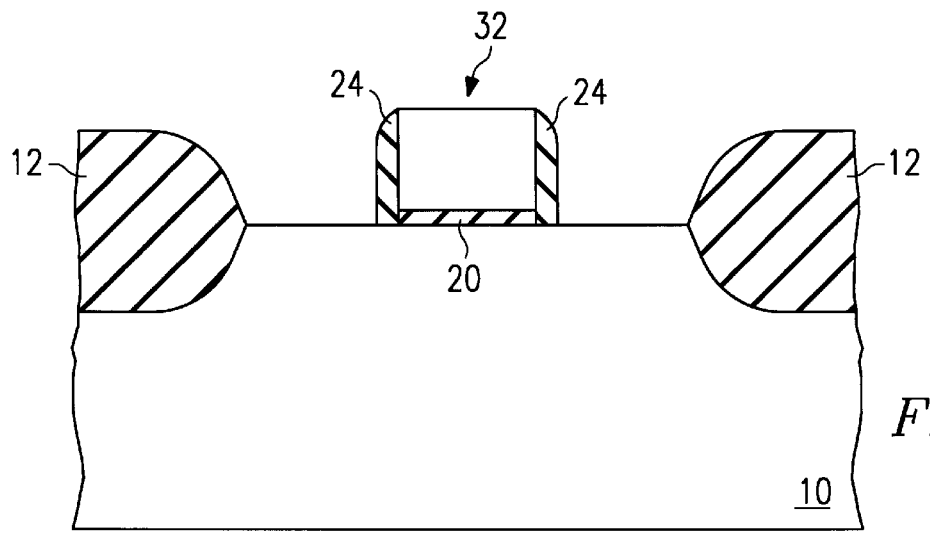
FIGS. 2A–2C are cross-sectional diagrams of the transistor of FIG. 1 at various stages of fabrication.

Referring to FIG. 2A, a gate structure 32 is formed on substrate 10. Gate structure 32 may comprise a gate electrode and gate dielectric or a disposable gate structure as is known in the art. If the gate electrode and dielectric are formed at this point (as opposed to a disposable gate), the gate dielectric may be a remote-plasma nitrided oxide for smaller (~0.1 micron) transistors. Other gate dielectric materials suitable include oxide or nitrided oxide by means other than remote-plasma nitridation. The gate pattern/etch may be accomplished with a deep UV surface-imaging lithography with linewidth reduction etch to achieve a short gate length.

Thin sidewall spacers 24 are then formed on the sidewalls of gate structure 32. Prior to formation of sidewall spacers 24, a thin thermal oxide of thickness 3–6 nanometers may be formed during a gate sidewall-reoxidation process to in part repair any gate etch damage to the underlying gate oxide. This thin thermal oxide from the sidewall re-oxidation process is not shown in FIG. 2A. Similarly, after formation of sidewall spacers 24, a thin thermal oxide of thickness ~2–3 nm may be formed if desired as a screen oxide before an subsequent implantation processes. Spacers 24 are formed prior to the highly doped drain (HDD) extension implant. This is done to reduce the gate to drain capacitance and thus the minimum gate length that the transistor can operate without excessive leakage between source and drain regions. Spacers 24 comprise a blocking material, preferably silicon nitride or silicon carbide. However, they may comprise any material having a smaller implant range than the substrate. The material is chosen to reduce the implant range of dopants thus preventing dopants from reaching the surface of substrate 10 under the spacer 24 during a subsequent angled implant and/or reducing the lateral extension of dopants from the drain extension edge inwards to the channel at the surface of substrate 10 during a subsequent angled implant. Another advantage of using silicon nitride or silicon carbide for spacers 24, is that the thickness of spacer 24 will not substantially decrease during subsequent clean-up or resist stripping processes. In contrast, the thickness of currently used oxide spacers is affected by these subsequent processes. As transistors continue to scale to smaller dimensions, slight variations or uncontrolled reductions in spacer thicknesses have greater impact on transistor characteristics.

Figure 2B:
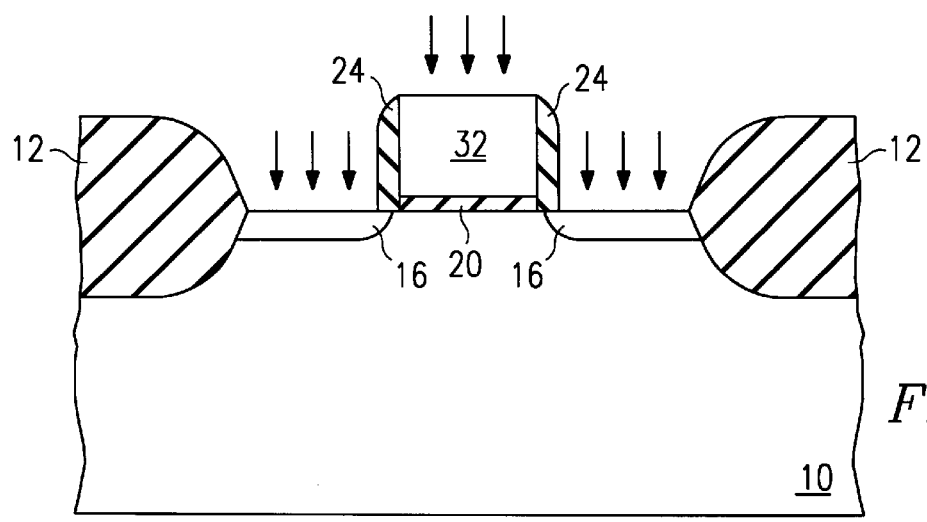

Referring to FIG. 2B, the NMOS and PMOS HDD implants are performed (The PMOS HDD region is not shown.) Preferably, a reduced energy implant of arsenic (n-type) or BF2 (p-type) at 10 keV–20 keV is used. A pre-amorphization implant (such as a low energy Sb, non-counterdoping implant for low diode leakage current) may be utilized prior to the PMOS HDD implant for shallower junctions. The HDD implant is shown as non-angled. However, angled HDD implants may be used if desired. For HDD implant at sufficiently reduced energies (such as less than 10 keV), it may be that the HDD implants can be performed prior to spacers 24 if the gate-source and gate-drain capacitance is acceptable. A typical HDD implant dose for arsenic of BF2 is in the range of $2E14–1.2E15/cm^2$.

Figure 2C:
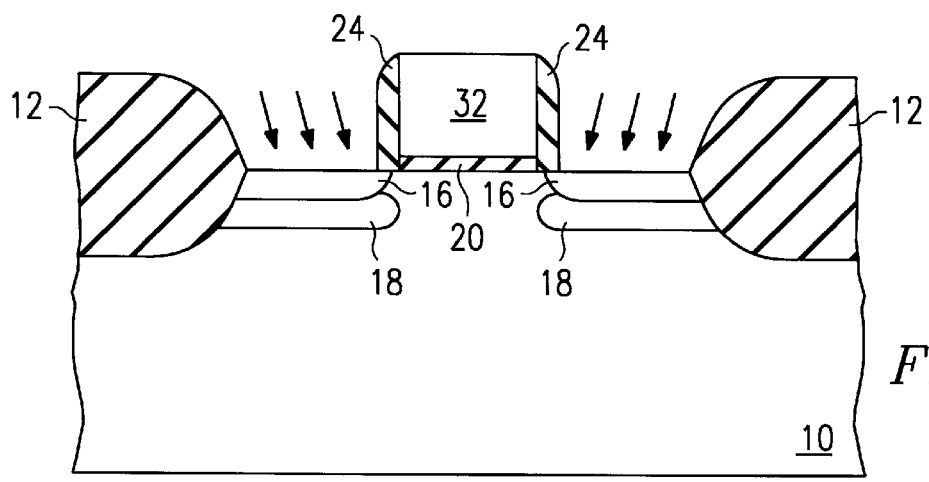

Next, angled pocket implants (of opposite conductivity to the HDD implant) are performed and the structure may then be subjected to a rapid thermal anneal (RTA), as shown in FIG. 2C. Preferably, an implant energy of 10–20 keV for B at an implant angle of 15–45 degrees is utilized for NMOS pocket implant although other pocket implant species as BF2 and Indium can be used with an appropriate change in energy dependent in part on the mass of the species. For example, Indium may be implanted at energies of 60–170 keV. Implant dose for each angled pocket implant may be in the range of 5E12–1.5E13 cm–2. Preferably, an implant energy of 30–70 keV for P at an implant angle of 15–45 degrees is utilized for PMOS pocket implant although other pocket implant species as As and Sb can be used with an appropriate change in energy dependent in part on the mass of the species. For example, Sb (or As) may be implanted at energies of 60–180 keV. Implant dose for each angled pocket implant may be in the range of 6E12–1.7E13 cm–2. Spacers 24 reduce the implant range of dopants thus preventing dopants from reaching the surface of substrate 10 and/or reduce the lateral extension of pocket dopants from the drain extension edge inwards to the channel at the surface of substrate 10 during an angled pocket implant. Dopant is placed below spacers 24 due to the angling of the implant. A pocket implant range distance on the order of 20–80 nanometers below the surface of the substrate is desired. It is noted that the order of the HDD implant and the pocket implant can be reversed if desired.

Figure 3:
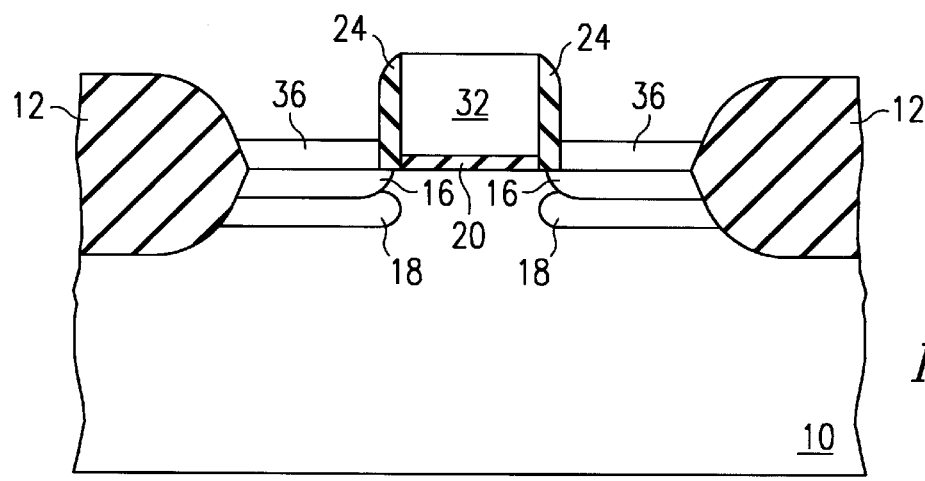
FIG. 3 is a cross-sectional diagram of a transistor having raised source/drain regions according to the invention.

Next, a second sidewall spacer 34 is formed followed by deep source/drain regions 14 being implanted and annealed if desired. Alternatively or additionally, raised source/drain regions 36 may be formed at this point as shown in FIG. 3. Method for forming raised source/drain regions are known in the art. For example, raised source/drain regions 36 may be formed by selective epitaxial growth. The raised source/drain regions 36 may then be implanted and annealed if desired. Subsequent salicidation or metal cladding over the source/drain and or gate regions can be performed if desired. Additionally, a dielectric layer may be formed over the source/drain regions or over the raised source/drain regions if present. The dielectric layer may be planarized to expose the top of gate structure 32 such that the disposable gate structure 32 is removed and replaced with a gate dielectric 20 and gate dielectric 22. Convention al backend processing as is well known in the art may then be utilized to complete device fabrication.

Figure 4:
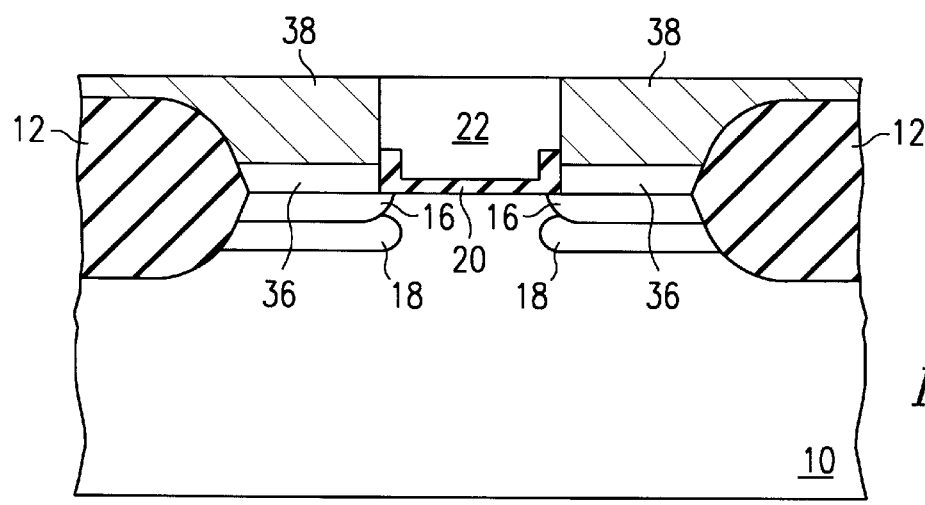
FIG. 4 is a cross-sectional diagram of a transistor according to a second embodiment of the invention.

A second embodiment of the invention is shown in FIG. 4. Transistor 40 is located in p-type substrate 10. Substrate 10 may alternatively refer to a p-type epitaxial layer formed on a substrate or a p-type well region formed in a substrate or epitaxial layer. Transistor 40 is isolated from other devices (not shown) by isolation regions 12. Isolation regions 12 are shown as field oxide regions. However, other types of isolation, such as shallow trench isolation, may also be used. Regions 16 are highly doped regions (n-type) sometimes referred to as drain extensions. Transistor 40 may also include deep source/drain regions (not shown). Transistor 40 includes raised source/drain regions 36.

Pocket regions 18 are doped oppositely to drain extension regions 16. In the case of the n-type transistor, regions 18 are p-type. Peak concentration of the pocket regions 18 are spaced from the surface of the substrate 10 to a greater extent and/or the lateral extent of a high pocket concentration at the channel surface, extending from the drain extension inwards to the channel region, is reduced as will be described. Thus, the benefits of traditional pocket regions, i.e., reduced threshold voltage rolloff, reduced nominal Vt, and improved nominal drive current, are maintained. In addition, drawback, of conventional pockets, i.e., enhanced dopant scattering due to enhanced dopant concentration over a large lateral extent near the channel surface, is significantly reduced. Because the pocket regions 18 do not have a peak concentration to a significant lateral extent at the surface and/or are spaced from the surface of the substrate, the dopant concentration at the surface of the channel is not significantly enhanced by the pocket as compared to conventional methods of forming transistors.

Gate electrode 22 is located on a gate dielectric 20. Gate delectric 20 may be any suitable gate dielectric known in the art. Typically, gate dielectric 20 will comprise an oxide. Gate electrode 22 comprises a conductive material such as polysilicon, silicide, metal, or a combination thereof.

A method for forming the second embodiment of the invention will now be described. The substrate 10 is processed through the formation of isolation regions 12 and any well implants and threshold adjust implants as is well known in the art.

Figure 5A:
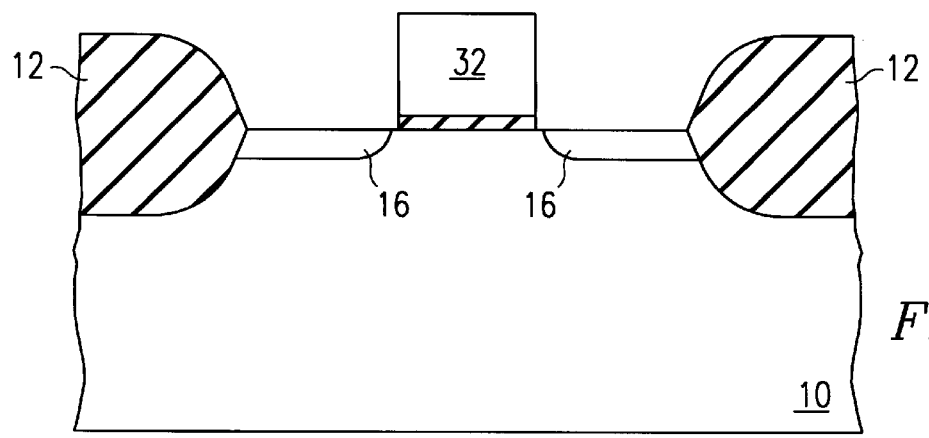
FIGS. 5A–5C are cross-sectional diagrams of the transistor of FIG. 4 at various stages of fabrication.

Referring to FIG. 5A, a disposable gate structure 32 is formed on to substrate 10. Disposable gate structure 32 may, for example, comprise a thin oxide with an overlying non-oxide material. The overlying non-oxide material is a blocking material, preferably silicon nitride or silicon carbide. However, it may comprise any material having a smaller implant range than the substrate. The material is chosen to reduce the implant range of dopants thus preventing dopants from reaching the surface of substrate 10 under the disposable gate structure 32 during a subsequent angled implant and/or reducing the lateral extension of dopants from the drain extension edge inwards to the channel at the surface of substrate 10 during a subsequent angled implant.

Still Referring to FIG. 5A, the NMOS and PMOS HDD implants are performed (The PMOS HDD region is not shown.) Preferably, a reduced energy implant of arsenic (n-type) or BF2 (p-type) at 10 keV or less is used. A pre-amorphization implant (such as a low energy Sb, non-counterdoping implant for low diode leakage current) may be utilized prior to the PMOS HDD implant for shallower junctions. The HDD implant is shown as non-angled. However, angled HDD implants may be used if desired. A typical HDD implant dose for arsenic of BF2 is in the range of 2E14–1.2E15/cm$^2$.

Figure 5B:
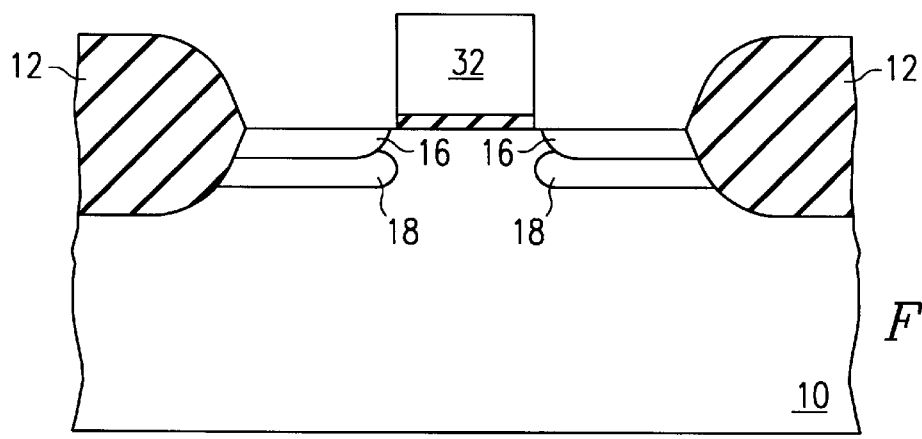

Next, angled pocket implants (of opposite conductivity to the HDD implant) are performed and the structure may then subjected to a rapid thermal anneal (RTA), as shown in FIG. 5B. Preferably, an implant energy of 10–20 keV for B at an implant angle of 15–45 degrees is utilized for NMOS pocket implant although other pocket implant species as BF2 and Indium can be used with an appropriate change in energy dependent in part on the mass of the species. For example, Indium may be implanted at energies of 60–170 keV. Implant dose for each angled pocket implant may be in the range of 5E12–1.5E13 cm–2. Preferably, an implant energy of 30–70 keV for P at an implant angle of 15–45 degrees is utilized for PMOS pocket implant although other pocket implant species as As and Sb can be used with an appropriate change in energy dependent in part on the mass of the species. For example, Sb (or As) may be implanted at energies of 60–180 keV. Implant dose for each angled pocket implant may be in the range of 6E12–1.7E13 cm–2. The blocking layer of disposable gate structure 32 reduce the implant range of dopants thus preventing dopants from reaching the surface of substrate 10 and/or reduce the lateral extension of pocket dopants from the drain extension edge inwards to the channel at the surface of substrate 10 during an angled pocket implant. Dopant is placed below disposable gate structure 32 due to the angling of the implant. An implant range distance on the order of 20–80 nanometers below the surface of the substrate is desired. It is noted that the order of the HDD implant and the pocket implant can be reversed if desired.

Figure 5C:
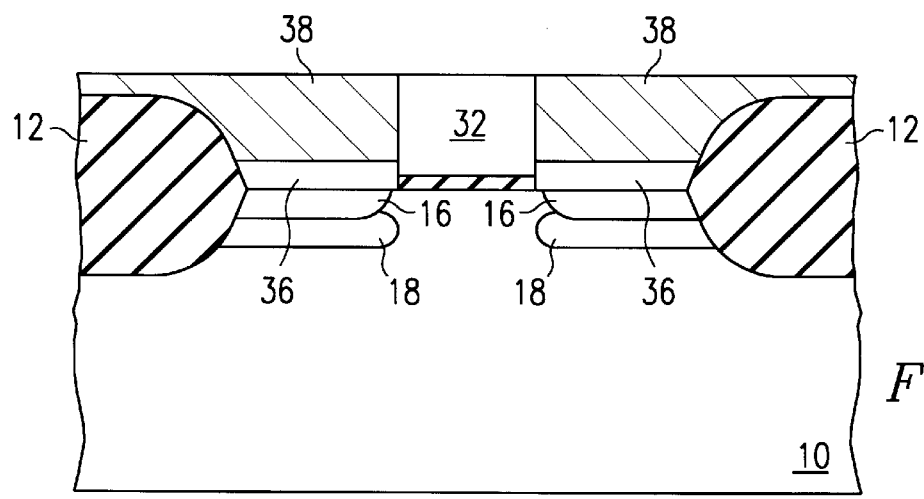

Referring to FIG. 5C, raised source/drain regions 36 are formed. Methods for forming raised source/drain regions are known in the art. For example, raised source/drain regions may be formed by selective epitaxial. After raised/source/drain regions 32 are formed an overlying dielectric layer 38 is deposited and planarized with disposable gate 32. Disposable gate 32 is then removed and replaced with a gate dielectric 20 and gate electrode 22.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating a transistor, comprising the steps of:

forming a gate dielectric over a semiconductor body;

forming a gate electrode over said gate dielectric;

forming an implant blocking spacer adjacent sidewalls of said gate electrode, wherein said implant blocking spacer comprises silicon nitride;

forming a first doped region of a first conductivity type in said semiconductor body adjacent said implant blocking spacer;

then, angle implanting a pocket region of a second conductivity type in said semiconductor body at least partially under said implant blocking spacer to form a pocket in said semiconductor body;

forming a sidewall spacer adjacent said implant blocking spacer after said angle implanting step; and forming deep source/drain region in said semiconductor body aligned to said sidewall spacer.

2. The method of claim 1, wherein said angle implanting step has an angle in the range of approximately 15–45 degrees.

3. The method of claim 1, wherein said angle implanting step implants boron at an energy in the range of approximately 10–20 keV.

4. The method of claim 1, wherein said angle implanting step implants phosphorous at an energy in the range of approximately 30–70 keV.

5. The method of claim 1, wherein said angle implanting step has an implant range of approximately 20–80 nm below a surface of said semiconductor body.

6. The method of claim 1, wherein the first doped region of first conductivity type is implanted at an energy of approximately 10–20 keV.

7. A method of fabricating a transistor, comprising the steps of:

forming a gate dielectric over a semiconductor body;

forming a gate electrode over said gate dielectric;

forming an implant blocking spacer adjacent sidewalls of said gate electrode, wherein said implant blocking spacer comprises silicon carbide;

forming a first doped region of a first conductivity type in said semiconductor body adjacent said implant blocking spacer;

then, angle implanting a pocket region of a second conductivity type in said semiconductor body at least partially under said implant blocking spacer to form a pocket in said semiconductor body;

forming a sidewall spacer adjacent said implant blocking spacer after said angle implanting step; and forming deep source/drain region in said semiconductor body aligned to said sidewall spacer.

8. The method of claim 7, wherein said angle implanting step has an angle in the range of approximately 15–45 degrees.

9. The method of claim 7, wherein said angle implanting step implants boron at an energy in the range of approximately 10–20 keV.

10. The method of claim 7, wherein said angle implanting step implants phosphorous at an energy in the range of approximately 30–70 keV.

11. The method of claim 7, wherein said angle implanting step has an implant range of approximately 20–80 nm below a surface of said semiconductor body.

12. The method of claim 7, wherein the first doped region of first conductivity type is implanted at an energy of approximately 10–20 keV.

* * * * *